(12) United States Patent
Zhang et al.

(10) Patent No.: US 11,075,652 B2
(45) Date of Patent: Jul. 27, 2021

(54) POLAR CODE TRANSMISSION METHOD AND APPARATUS

(71) Applicant: HUAWEI TECHNOLOGIES CO., LTD., Guangdong (CN)

(72) Inventors: Gongzheng Zhang, Hangzhou (CN); Hejia Luo, Hangzhou (CN); Rong Li, Hangzhou (CN); Jian Wang, Hangzhou (CN); Jun Wang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/661,832

(22) Filed: Oct. 23, 2019

(65) Prior Publication Data
US 2020/0059245 A1  Feb. 20, 2020

Related U.S. Application Data

(63) Continuation of application No. PCT/CN2018/084343, filed on Apr. 25, 2018.

(30) Foreign Application Priority Data

Apr. 25, 2017 (CN) .......................... 201710279367.5

(51) Int. Cl.
*G06K 5/04* (2006.01)
*H03M 13/13* (2006.01)
(Continued)

(52) U.S. Cl.
CPC .......... *H03M 13/13* (2013.01); *H03M 13/09* (2013.01); *H03M 13/27* (2013.01); *H03M 13/635* (2013.01)

(58) Field of Classification Search
CPC ...... H03M 13/13; H03M 13/09; H03M 13/27; H03M 13/635
See application file for complete search history.

(56) References Cited

U.S. PATENT DOCUMENTS 10,075,197 B1 * 9/2018 Noh ................. H03M 13/2906
2015/0091742 A1 * 4/2015 Ionita ................ H03M 13/251
341/57
(Continued)

FOREIGN PATENT DOCUMENTS

CN  104219019 A  12/2014
CN  106100794 A  11/2016

OTHER PUBLICATIONS

Interdigital Communications:"Considerations on SS Burst Design and Indication", 3GPP Draft; R1-1702315,Feb. 12, 2017 (Feb. 12, 2017),XP051209469,total 5 pages.
(Continued)

*Primary Examiner* — Samir W Rizk
(74) *Attorney, Agent, or Firm* — Womble Bond Dickinson (US) LLP

(57) ABSTRACT

This application provides a polar code transmission method and apparatus. The method includes: transforming a to-be-processed bit sequence at two or more different granularities, where each specific manner at a first granularity is used to implicitly indicate one value in one level of time sequence information, and each specific manner at a second granularity is used to implicitly indicate one value in another level of time sequence information; and sending the transformed (processed) bit sequence, so that different encoded bit sequences can be obtained, and more versions of time sequence information can be implemented, thereby meeting a requirement of transmission in a plurality of levels of time sequences.

20 Claims, 19 Drawing Sheets

Transform a to-be-processed bit sequence at two or more different granularities, where each specific manner at one granularity is used to implicitly indicate one value in one level of time sequence information, and each specific manner at another granularity is used to implicitly indicate one value in another level of time sequence information — S301

Send the transformed bit sequence — S302

(51) Int. Cl.
  *H03M 13/09*   (2006.01)
  *H03M 13/27*   (2006.01)
  *H03M 13/00*   (2006.01)

(56) References Cited

U.S. PATENT DOCUMENTS

2018/0351695 A1* 12/2018 Yang .................. H04L 1/0045
2018/0358985 A1* 12/2018 Kim .................. H03M 13/2792
2019/0268025 A1   8/2019 Shen et al.

OTHER PUBLICATIONS

Huawei et al, "Polar Code Construction for NR",3GPP TSG RAN WG1 Meeting #86bis,R1-1608862,Lisbon, Portugal, Oct. 10-14, 2016, total 8 pages.

Interdigital Communications:"On NR-PBCH Transmission",3GPP Draft; R1-1705500,Apr. 2, 2017 (Apr. 2, 2017), XP051243629,total 8 pages.

Erdal Arikan et al, "Challenges and Some New Directions in Channel Coding", Journal of Communications and Networks, vol. 17, No. 4, Aug. 2015, total 11 pages.

Qualcomm Incorporated: "SS burst composition and time index indication considerations",3GPP Draft; R1-1702585,Feb. 12, 2017 (Feb. 12, 2017},XP051209739,total 6 pages.

Huawei et al:"Discussion on SS burst set composition and SS block time index indication",3GPP Draft; R1-1703353,Feb. 12, 2017 (Feb. 12, 2017),XP051210483,total 7 pages.

\* cited by examiner

FIG. 11

Time sequence group 1

| Time sequence 1 | $C_1$ | $C_2$ | $C_3$ | $C_4$ |
|---|---|---|---|---|
| Time sequence 2 | $C_4$ | $C_1$ | $C_2$ | $C_3$ |
| Time sequence 3 | $C_3$ | $C_4$ | $C_1$ | $C_2$ |
| Time sequence 4 | $C_2$ | $C_3$ | $C_4$ | $C_1$ |

Time sequence group 2

| Time sequence 1 | $C_1+1$ | $C_2+1$ | $C_3+1$ | $C_4+1$ |
|---|---|---|---|---|
| Time sequence 2 | $C_4+1$ | $C_1+1$ | $C_2+1$ | $C_3+1$ |
| Time sequence 3 | $C_3+1$ | $C_4+1$ | $C_1+1$ | $C_2+1$ |
| Time sequence 4 | $C_2+1$ | $C_3+1$ | $C_4+1$ | $C_1+1$ |

FIG. 16

Time sequence group 1

| Time sequence 1 | $C_1$ | $C_2$ | $C_3$ | $C_4$ |
|---|---|---|---|---|
| Time sequence 2 | $C_1+1$ | $C_2+1$ | $C_3+1$ | $C_4+1$ |

Time sequence group 2

| Time sequence 1 | $C_4$ | $C_1$ | $C_2$ | $C_3$ |
|---|---|---|---|---|
| Time sequence 2 | $C_4+1$ | $C_1+1$ | $C_2+1$ | $C_3+1$ |

Time sequence group 3

| Time sequence 1 | $C_3$ | $C_4$ | $C_1$ | $C_2$ |
|---|---|---|---|---|
| Time sequence 2 | $C_3+1$ | $C_4+1$ | $C_1+1$ | $C_2+1$ |

Time sequence group 4

| Time sequence 1 | $C_2$ | $C_3$ | $C_4$ | $C_1$ |
|---|---|---|---|---|
| Time sequence 2 | $C_2+1$ | $C_3+1$ | $C_4+1$ | $C_1+1$ |

POLAR CODE TRANSMISSION METHOD AND APPARATUS

CROSS-REFERENCE TO RELATED APPLICATIONS

This application is a continuation of International Application No. PCT/CN2018/084343, filed on Apr. 25, 2018, which claims priority to Chinese Patent Application No. 201710279367.5, filed on Apr. 25, 2017. The aforementioned patent applications are incorporated herein by reference in their entirety.

TECHNICAL FIELD

This application relates to the field of communications technologies, and in particular, to a polar code transmission method and apparatus.

BACKGROUND

In a communications system, channel coding is usually used to improve data transmission reliability and ensure communication quality. A polar code is strictly proved to be a first channel coding method that can "achieve" a channel capacity. The polar code is a linear block code. A generation matrix of the polar code is $G_N$, and an encoding process of the polar code is $x_1^N = u_1^N G_N$, where $u_1^N = (u_1, u_2, K, u_N)$ is a binary row vector and has a length of N (namely, a code length); and $G_N = B_N F_2^{\otimes (\log_2(N))}$. Herein, $$F_2 = \begin{bmatrix} 1 & 0 \\ 1 & 1 \end{bmatrix},$$

$B_N$ is a N×N transposed matrix, for example, a bit reversal order transposed matrix, and $F_2^{\otimes (\log_2(N))}$ is defined as a Kronecker product of $\log_2 N$ matrices $F_2$. In the encoding process of the polar code, some bits in $u_1^N$ are used to carry information, and are referred to as information bits. A set of indexes of the information bits is denoted as A. The other bits of $u_1^N$ are set to fixed values that are agreed on by a transmit end and a receive end in advance, and are referred to as fixed bits. A set of indexes of the fixed bits is represented by a complementary set $A^c$ of A. A fixed bit is usually set to 0. A fixed bit sequence can be randomly set, provided that the transmit end and the receive end agree in advance. Therefore, an encoded output of the polar code may be simplified as: $x_1^N = u_A G_N(A)$. Herein, $u_A$ is a set of information bits in $u_1^N$, $u_A$ is a row vector of a length of K, that is, $|A|=K$, $|\bullet|$ represents a quantity of elements in the set, K is an information block size, $G_N(A)$ is a submatrix derived from rows corresponding to indexes in the set A in the matrix $G_N$, and $G_N(A)$ is a K×N matrix. A construction process of the polar code is a selection process of the set A. This determines performance of the polar code.

In a long term evolution (LTE) system, a master information block (master information block, MIB) is transmitted through a physical broadcast channel (PBCH). A length of the MIB is 24 bits and the MIB includes downlink bandwidth, a physical hybrid ARQ indicator channel (PHICH), and high 8 bits of a system frame number (SFN). FIG. 1 is a schematic flowchart of sending a PBCH by a base station. As shown in FIG. 1, the base station adds 16-bit CRC checks to a MIB, to obtain a 40-bit sequence. Then the base station performs channel coding and rate matching to obtain an encoded sequence. A PBCH is repeatedly sent four times in one period (40 ms), the PBCH sent each time carries a same encoded sequence, and four different sequences are scrambled to enable the PBCH sent each time to implicitly carry information about the last 2 bits of an SFN. Finally, the base station performs modulation, resource mapping, and sending processes. FIG. 2 is a schematic flowchart of receiving a PBCH by a terminal device. As shown in FIG. 2, after receiving the PBCH, the terminal device first performs demapping and demodulation, and then performs descrambling by using each of four possible scrambling sequences to attempt to perform decoding and a CRC check. If the decoding is successful, the terminal device can learn of a number of a system frame, in a period, in which a base station sends a MIB, that is, learn of the lowest 2 bits of an SFN. If the decoding fails, the terminal device performs soft combination with content of a PBCH that is sent next time, and then performs decoding, until the PBCH is successfully obtained through decoding.

In the prior art, communication performance of polar encoding and decoding needs to be further improved.

SUMMARY

This application provides a polar code transmission method and apparatus.

According to a first aspect, a polar code transmission method is provided. The method includes: transforming (for example, interleaving (performing a cyclic shift) or scrambling) a to-be-processed bit sequence at two or more different granularities, where each specific manner at one granularity is used to implicitly indicate one value in one level of time sequence information, and each specific manner at another granularity is used to implicitly indicate one value in another level of time sequence information; and sending the transformed (processed) bit sequence.

According to a second aspect, a polar code transmission apparatus is further provided. Specifically, the apparatus includes units configured to perform the method according to any one of the first aspect or implementations of the first aspect.

According to a third aspect, an implementation of this application provides a polar code transmission apparatus. Specifically, the apparatus includes a memory and a processor. The memory is connected to the processor by using a bus system. The memory is configured to store an instruction. The processor is configured to execute the instruction stored in the memory. When the instruction is executed, the processor performs the method according to any one of the first aspect or implementations of the first aspect.

According to a fourth aspect, this application provides a non-transitory computer-readable medium, configured to store a computer program. The computer program includes an instruction for performing the method according to any one of the first aspect or implementations of the first aspect.

According to the polar code transmission method provided in embodiments, the to-be-processed bit sequence is transformed at the two or more different granularities, where each specific manner at one granularity is used to implicitly indicate one value in one level of time sequence information, and each specific manner at another granularity is used to implicitly indicate one value in another level of time sequence information; and the transformed (processed) bit sequence is sent, so that different encoded bit sequences can be obtained, and more versions of time sequence information can be implemented, thereby meeting a requirement of transmission in a plurality of levels of time sequences.

BRIEF DESCRIPTION OF DRAWINGS

FIG. 11 is a schematic diagram of a submatrix $T_1$, where the submatrix $T_1$ corresponds to a transformation matrix shown in FIG. 11;

FIG. 16 is a diagram of an example of transmission in two levels of time sequences;

FIG. 17 is a diagram of an example of transmission in two levels of time sequences;

DESCRIPTION OF EMBODIMENTS

This application relates to a channel coding technology for improving information transmission reliability and ensuring communication quality in a 5G communications scenario. This application may be applied to a scenario in which polar encoding and decoding are performed on information, for example, may be applied to a scenario in which polar encoding and decoding are performed on enhanced mobile broadband (eMBB) uplink control information and downlink control information, or may be applied to another scenario, for example, applied to channel coding in the communications standard TS 36.212 5.1.3, and channel coding sections of uplink control information, downlink control information, and a sidelink channel. This is not limited in this application. More specifically, this application may be mainly applied to a scenario in which a PBCH or other information needs to be implicitly transmitted.

Figure 1:
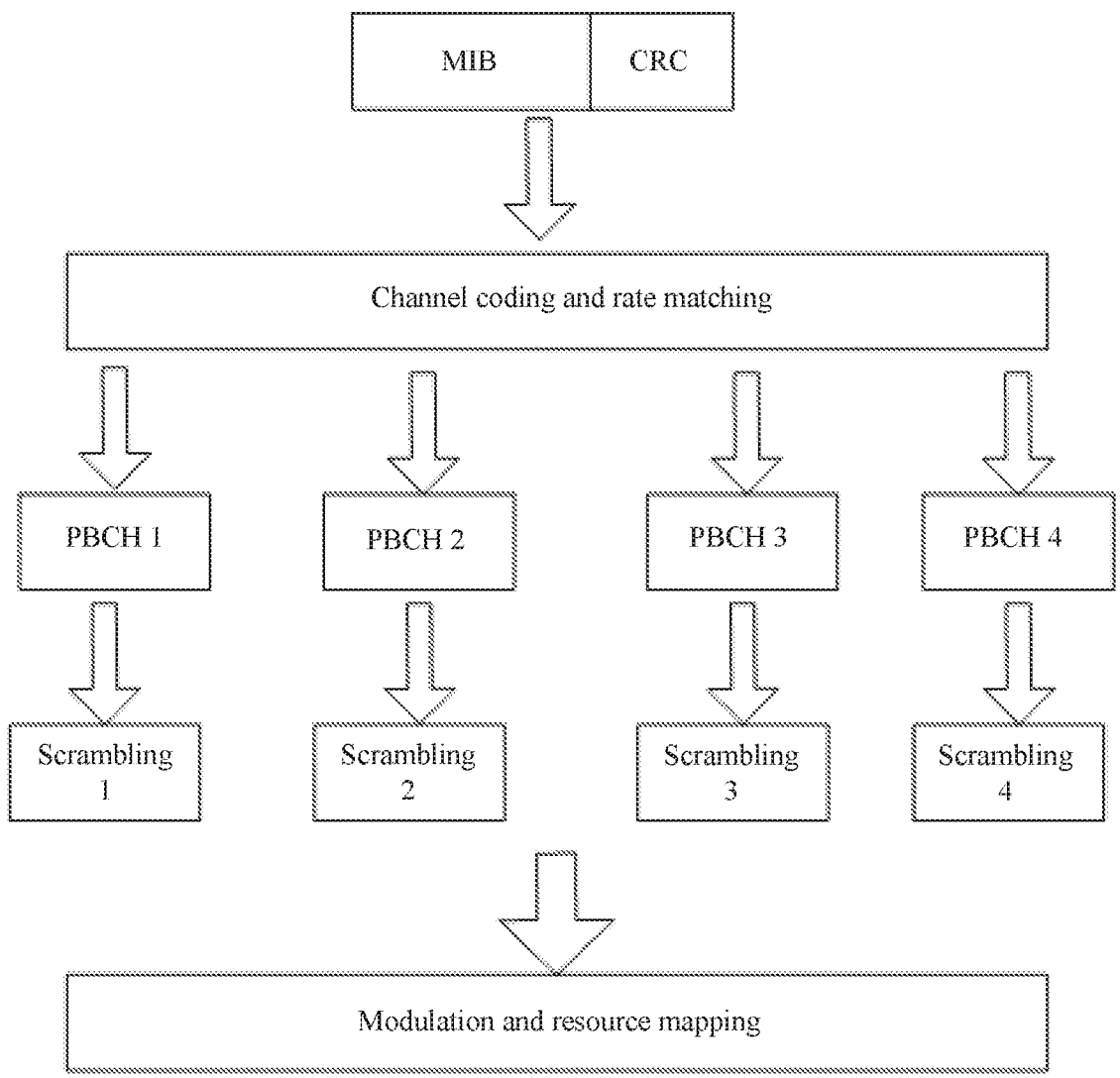
FIG. 1 is a schematic flowchart of a communications system.
Figure 2:
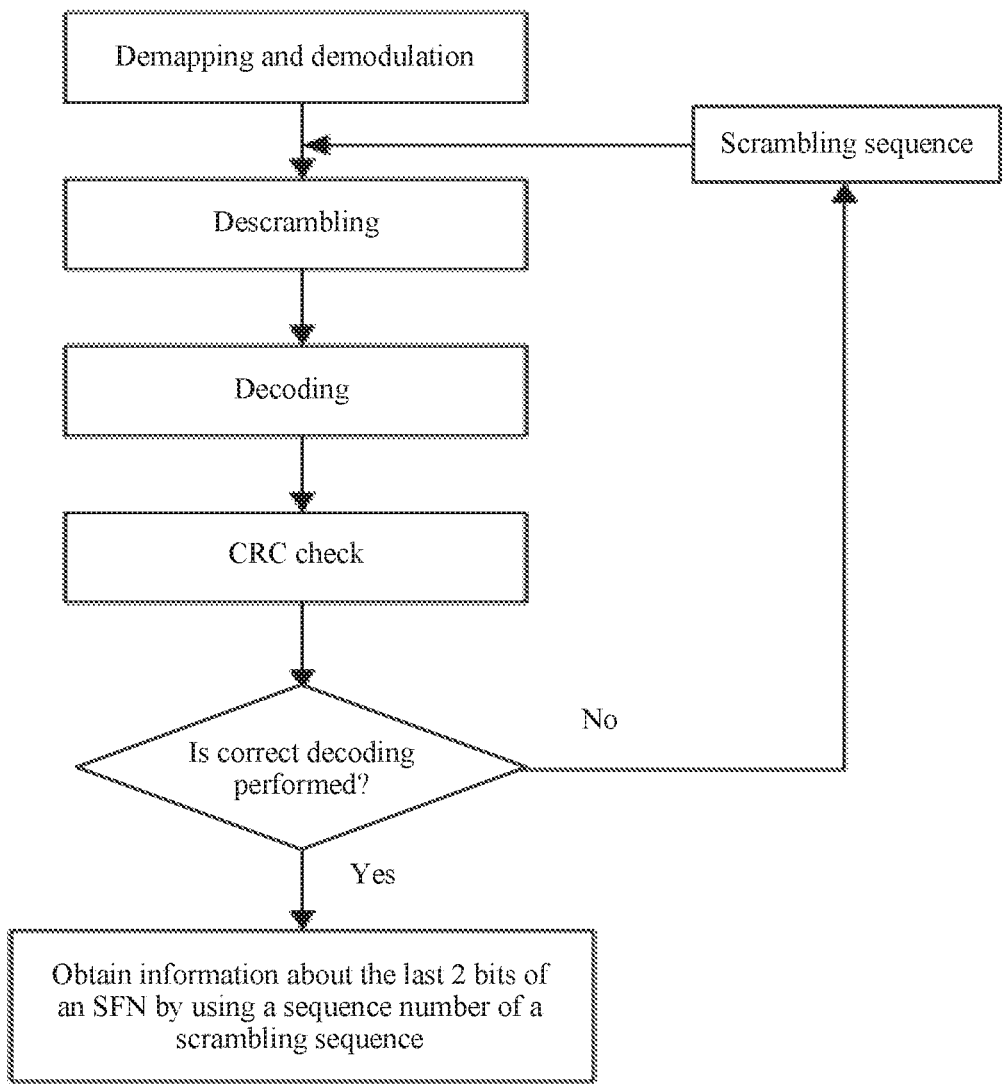
FIG. 2 is a schematic diagram of an encoding process of a polar code.
Figure 3:
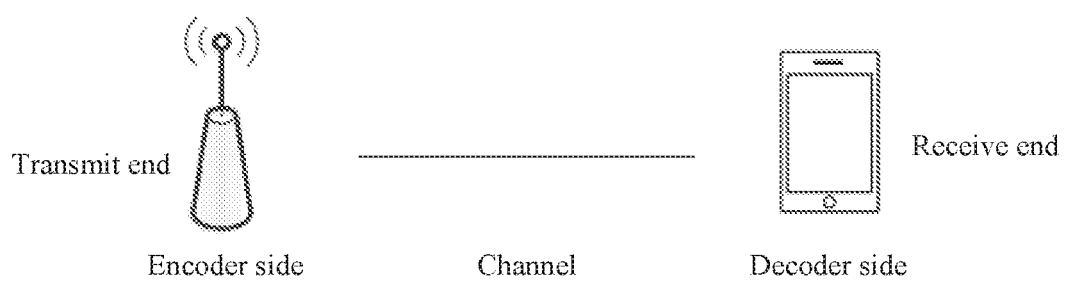
FIG. 3 is a schematic diagram of a system architecture of a transmit end and a receive end according to this application.

A communications system in this application may include a transmit end and a receive end. FIG. 3 is a schematic diagram of a system architecture of a transmit end and a receive end according to this application. As shown in FIG. 3, the transmit end is an encoder side, and may be configured to: encode and output encoded information, and transmit the encoded information to a decoder side on a channel. The receive end is the decoder side, and may be configured to: receive the encoded information sent by the transmit end, and decode the encoded information. The transmit end and the receive end may be terminals, servers, base stations, or other devices that can perform encoding and decoding. This is not limited in this application. The terminal may be a personal computer (PC), a mobile phone, a tablet computer (pad), an intelligent learning machine, an intelligent game console, a smart television, smart glasses, a smartwatch, or the like.

Figure 4:
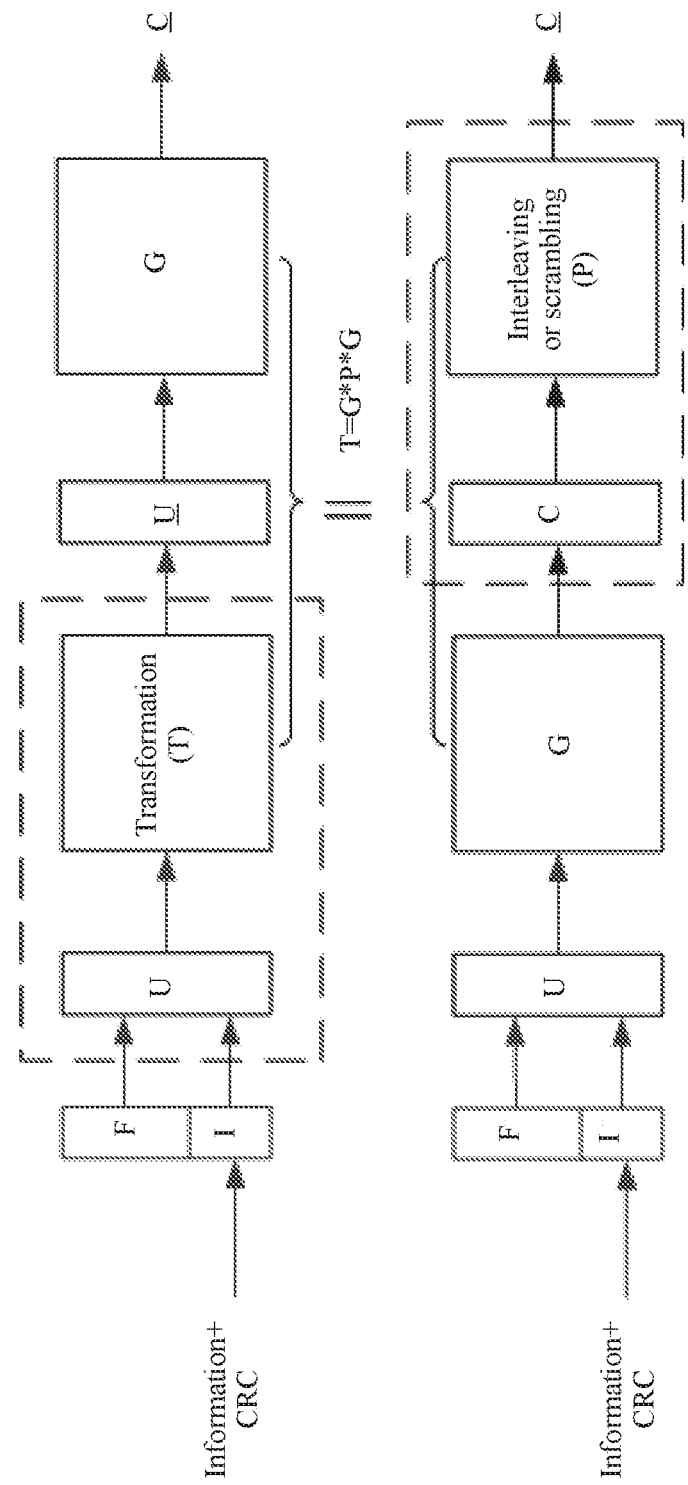
FIG. 4 is a schematic diagram of an equivalent procedure of a transformation operation of a polar code.

Usually, a transformation operation of an encoded bit sequence may be equivalent to first performing a transformation operation on a bit existing before encoding and then encoding the transformed bit. For a cyclic code (such as a TBCC), if a transformation operation is a cyclic shift, a cyclic shift of an encoded codeword is equivalent to performing a cyclic shift on an information block existing before encoding and then encoding the information block. For a polar code, an encoding matrix structure of the polar code has no cyclic feature, and interleaving of a bit sequence obtained after encoding by using the polar code is equivalent to performing a transformation operation on a bit existing before encoding and then performing encoding by using the polar code. FIG. 4 is a schematic diagram of an equivalent procedure of a transformation operation of a polar code. As shown in FIG. 4, after cyclic redundancy check bits are added to information bits in to-be-encoded information, a bit existing before encoding is U, U is encoded by using the polar code, and $x_1^N = u_A G_N(A)$. Herein, $G_N(A)$ corresponds to G in FIG. 4, and U corresponds to $u_A$ in FIG. 4. An encoded bit sequence C is obtained. Then hierarchical interleaving or scrambling is performed on C to obtain C̲, which is equivalent to transforming, by using a transformation matrix T, the bit U existing before encoding, to obtain U̲, and then performing polar encoding on U̲, to obtain the encoded bit sequence C̲. If a transformation matrix for the bit existing before encoding by using the polar code is T, and an interleaving transformation matrix of the encoded bit is P, the transformation matrices meet T=G*P*G. If an interleaving operation is a cyclic shift, the transformation matrix T has a special form that is an upper triangular Toeplitz matrix. A valid interleaving operation needs to meet the following condition: The transformation operation on the bit existing before encoding does not affect a value of a frozen bit, that is, the value of the frozen bit remains unchanged before and after transformation. In a condition that frozen bits are all set to 0s, it needs to be ensured that the frozen bit existing before and after the transformation is merely a function of a frozen bit and is not affected by an information bit. This is because the value of the frozen bit needs to be known in advance before decoding is performed by using the polar code; otherwise, normal decoding cannot be performed.

Figure 5A:
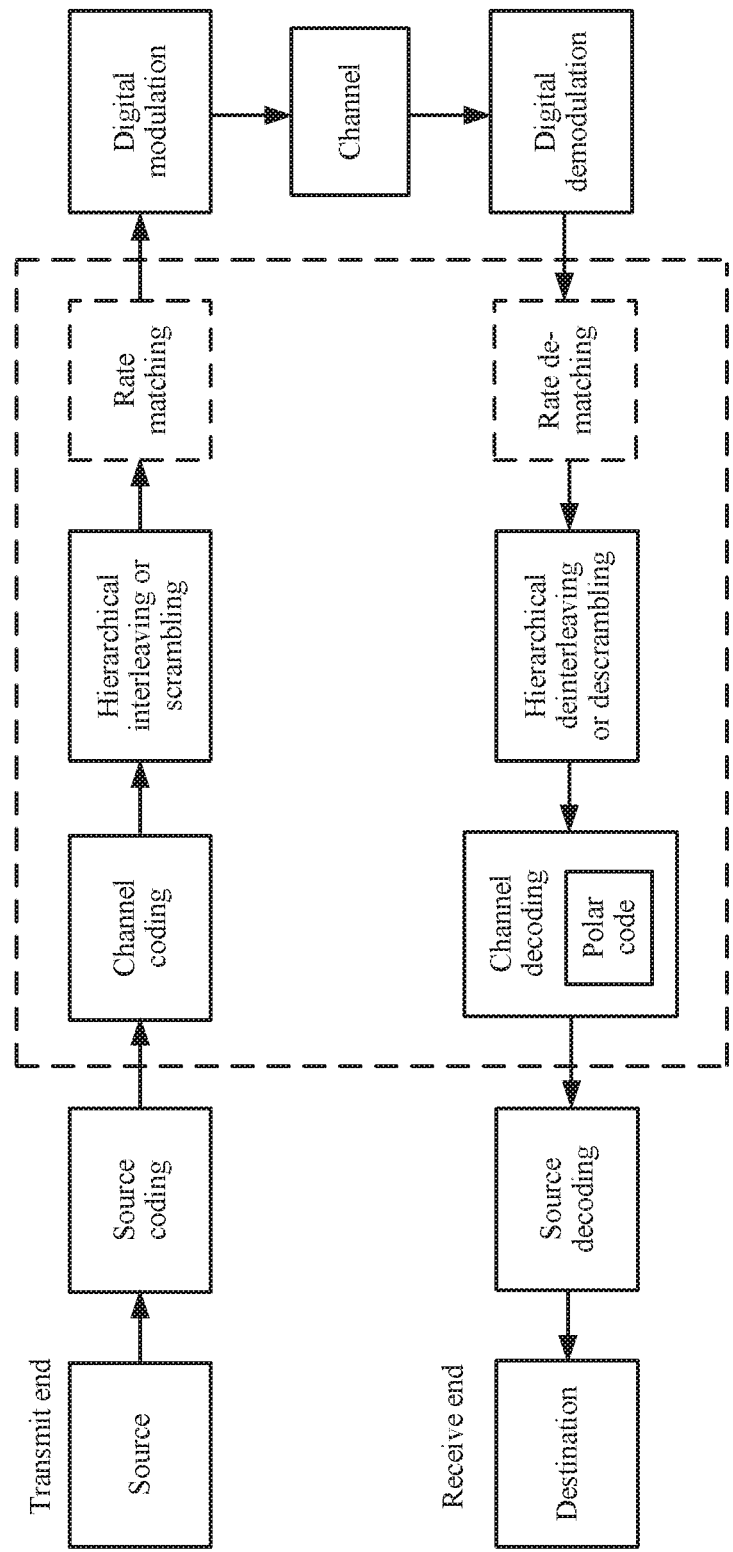
FIG. 5a and FIG. 5b each are a schematic diagram of a processing procedure at a physical layer in a wireless communications system.
Figure 5B:
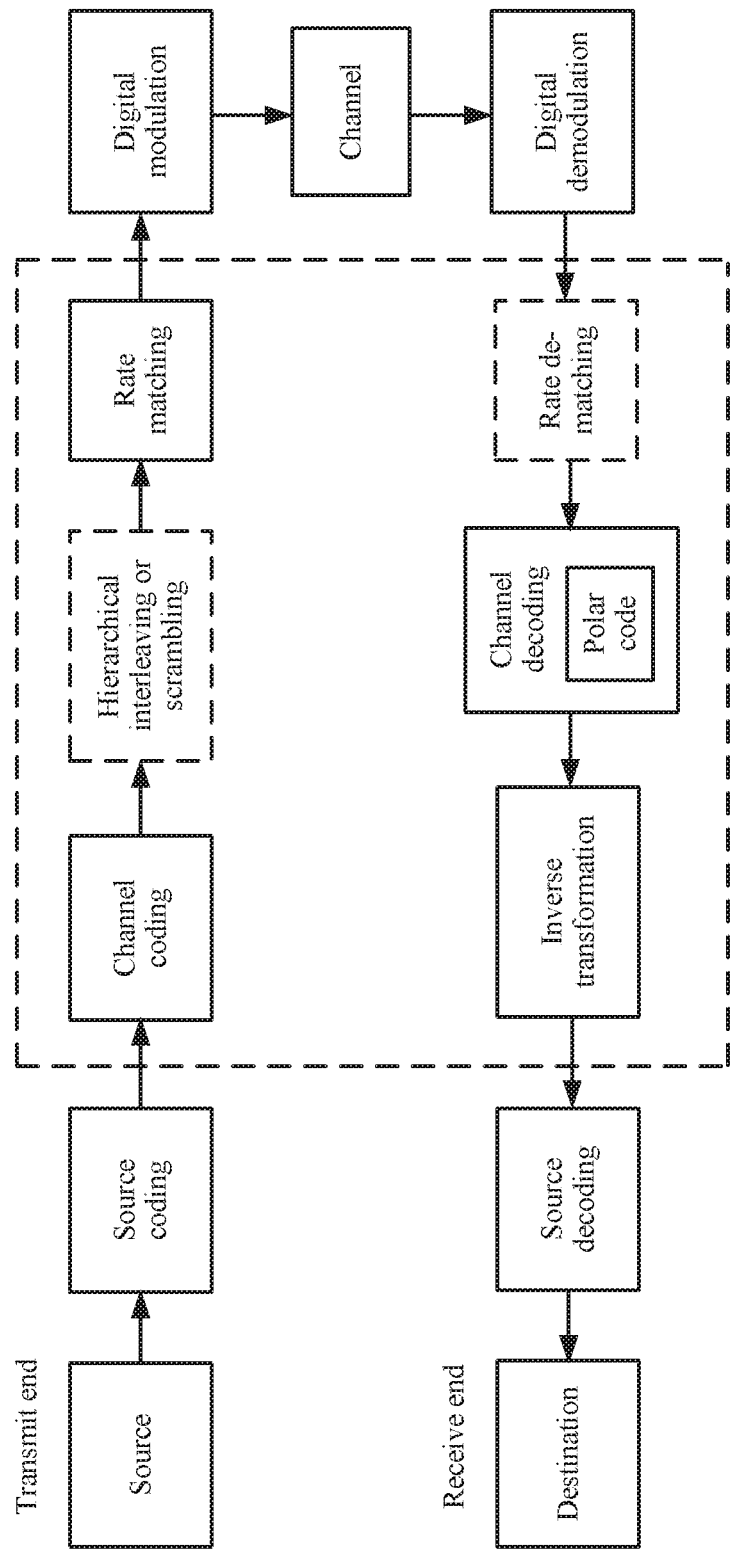

FIG. 5a and FIG. 5b each are a schematic diagram of a processing procedure at a physical layer in a wireless communications system. At a transmit end, an information source is sent to a receive end through a channel after source coding, channel coding or rate matching, and digital modulation are performed. At the receive end, digital demodulation, rate de-matching, channel decoding, and source decoding are performed on a signal received through the channel, to obtain a destination. In an implementation of this application, transmission is performed based on hierarchical interleaving or scrambling performed on hierarchical time sequence information, so that more time sequence information can be implicitly carried. The hierarchical interleaving or scrambling process is performed after the channel coding and before the rate matching, and a length of a bit sequence on which hierarchical interleaving or scrambling is performed is a length of a mother code of a polar code. The hierarchical interleaving or scrambling process may alternatively be performed after the rate matching, and a length of a bit sequence on which hierarchical interleaving or scrambling is performed is a target length obtained after the rate matching. Referring to FIG. 5a, the hierarchical interleaving or scrambling process is performed after the channel coding and before the rate matching. Referring to FIG. 5a, correspondingly, at the receive end, hierarchical deinterleaving or descrambling is performed after the rate de-matching and before the channel decoding. Referring to FIG. 5b, equivalent transformation is performed before the channel coding in the hierarchical interleaving or scrambling process, and correspondingly, at the receive end, inverse transformation is performed after the channel decoding.

To implicitly carry the time sequence information, in a related technology, in a method, a PBCH sent each time carries a same encoded sequence, and four different sequences are scrambled to enable the PBCH sent each time to implicitly carry time sequence information (for example, information about the last 2 bits of an SFN). However, for the receive end, if decoding is required after all possible scrambling code sequences are attempted, a latency is relatively high. If a required version is greater than 4, the latency is higher.

Figure 6:
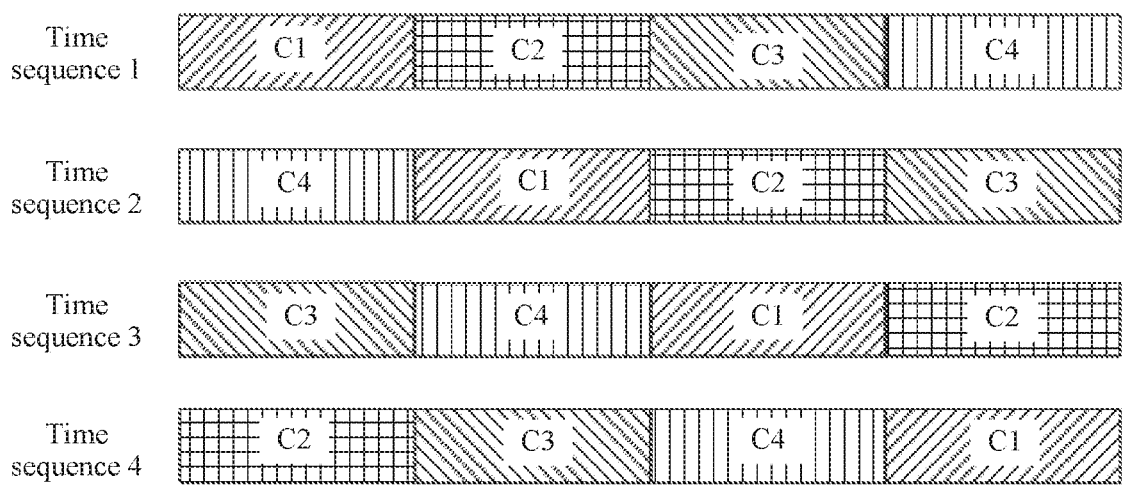
FIG. 6 is a schematic diagram of cyclic shifts corresponding to different time sequences.

In the related technology, in another method, progressive interleaving is performed on an encoded codeword (bit sequence) during transmission of a PBCH, to implicitly carry time sequence information. For example, before each transmission in a PBCH period, a cyclic shift of a fixed length is performed on a codeword in a previous transmission. FIG. 6 is a schematic diagram of cyclic shifts corresponding to different time sequences. As shown in FIG. 6, a codeword obtained after polar encoding is divided into four segments of equal lengths that are denoted as $C_1, C_2, C_3,$ and $C_4$. During transmission in each time sequence, a cyclic shift is performed on an encoded codeword transmitted a previous time, and a value of each shift is N/4, where N is a length of a codeword obtained after polar encoding, for example, a first shift is 0, a second shift is N/4, a shift of N/4 is performed in the second shift based on the first shift, and so on. When receiving signals transmitted a plurality of times, UE first performs an inverse cyclic shift based on a relative shift of the transmit end, then performs soft combination and decoding, and finally blindly detects an absolute length of the cyclic shift through a CRC check, to finally obtain corresponding time sequence information. However, a valid cyclic shift operation generates limited available versions. Currently, a value of a cyclic shift meeting a PBCH requirement can be only N/2 or N/4, that is, only two or four versions can be generated, and a maximum of four different pieces of time sequence information can be implicitly carried.

Figure 7:
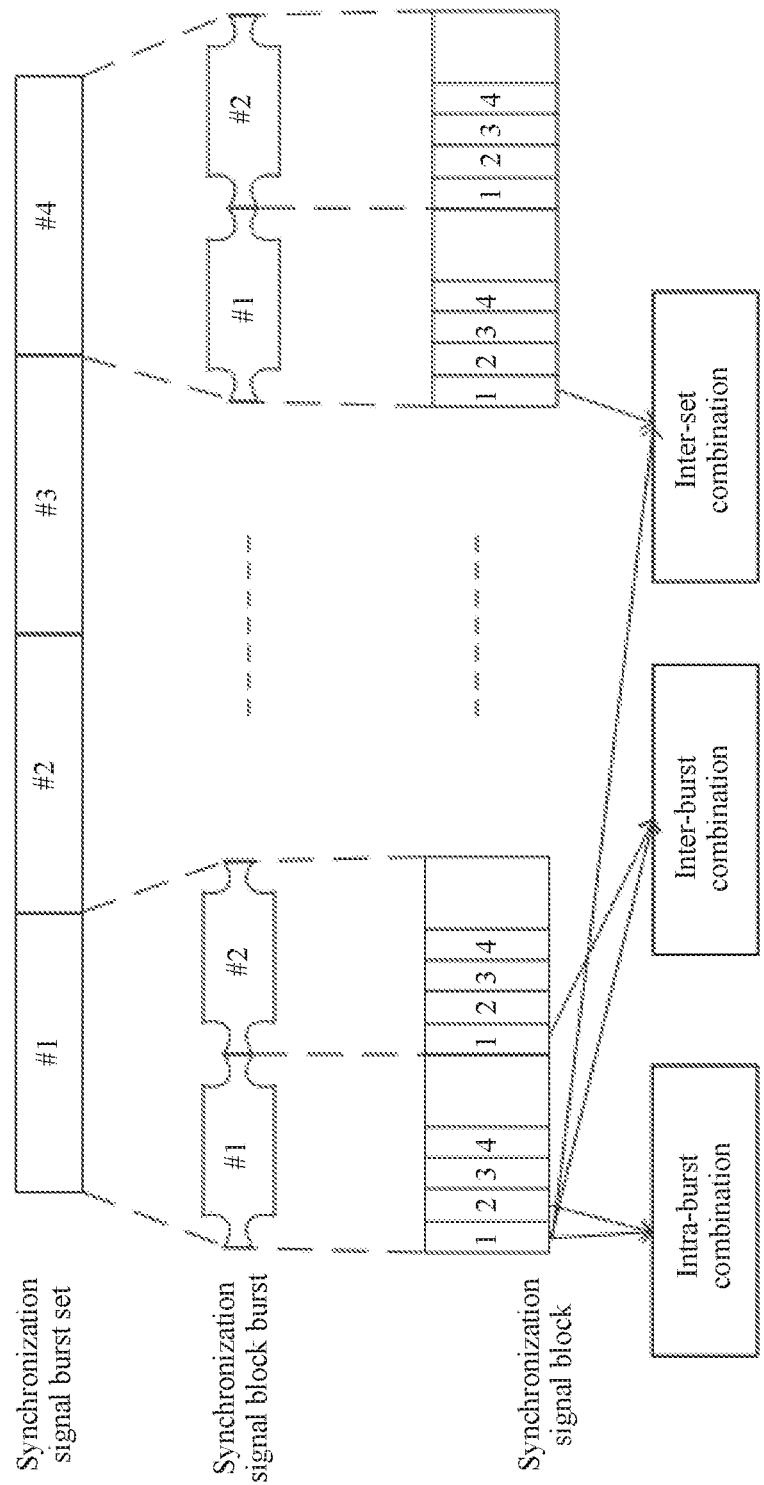
FIG. 7 is a schematic structural diagram of a PBCH.

In a 5th mobile communications system (5th-generation, 5G), because of introduction of a high frequency, a significant change in a structure of a 5G PBCH compared with LTE is an increase in a quantity of times of sending the PBCH. FIG. 7 is a schematic structural diagram of a PBCH. As shown in FIG. 7, a 5G PBCH is carried in a synchronization signal block, a plurality of synchronization signal blocks (SS block) form one synchronization signal burst, and a plurality of synchronization signal bursts (SS burst) form a synchronization signal burst set (SS burst set). There are the following requirements for soft combination of synchronization signal blocks: Combination is performed in one synchronization signal burst, combination is performed between different synchronization signal bursts, or combination is performed between different synchronization signal burst sets. Therefore, there is a hierarchical structure for sending the 5G PBCH, and correspondingly, a multi-level time sequence indication is required. Correspondingly, an original polar code transmission method needs to be improved, to meet a requirement of transmission of the 5G PBCH in a plurality of levels of time sequences. A polar code transmission method and apparatus provided in this application are described below with reference to the accompanying drawings.

This application is mainly applied to various wireless communications systems, and this application is applied to a digital signal processing unit in the systems, to improve reliability of wireless communication.

Figure 8:
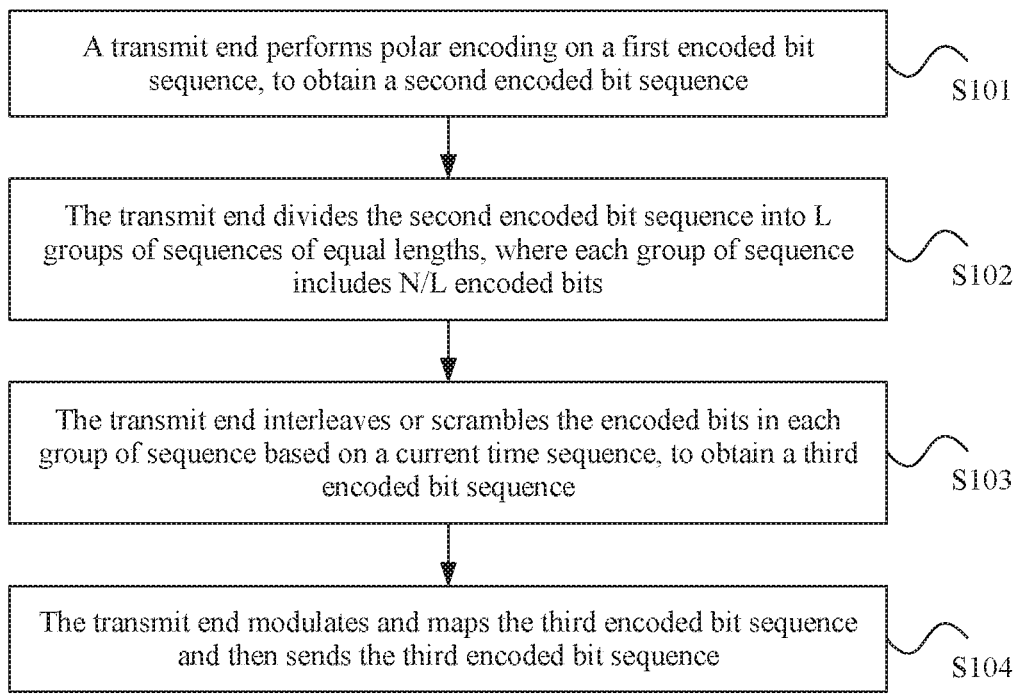
FIG. 8 is a flowchart of an embodiment of a polar code transmission method according to this application.

FIG. 8 is a flowchart of an embodiment of a polar code transmission method according to this application. As shown in FIG. 8, the method in this embodiment may include the following operations.

In operation S101, a transmit end performs polar encoding on a first encoded bit sequence, to obtain a second encoded bit sequence.

Specifically, the first encoded bit sequence may include information bits and CRC bits in to-be-encoded information. When the CRC bits are included, the transmit end adds the CRC bits to information bits in the to-be-encoded information, to obtain the first encoded bit sequence. A PBCH is used as an example. A base station adds 16-bit CRC bits to a 24-bit MIB, to obtain a 40-bit sequence, and then performs polar encoding on the first encoded bit sequence, to obtain the second encoded bit sequence.

In operation S102, the transmit end divides the second encoded bit sequence into L groups of sequences of equal lengths, where each group of sequence includes N/L encoded bits, N is a length of the second encoded bit sequence, and L and N are positive integers.

In operation S103, the transmit end interleaves or scrambles the encoded bits in each group of sequence based on a current time sequence, to obtain a third encoded bit sequence.

In operation S104, the transmit end modulates and maps the third encoded bit sequence and then sends the third encoded bit sequence.

Each group of sequence is interleaved in a same manner during one transmission, and a value of a cyclic shift in the group carries time sequence information. Similar to a cyclic shift of an entire codeword, a receive end first performs an inverse cyclic shift on the groups, combines a plurality of received signals, then performs decoding, and finally performs inverse transmission, a CRC check, and blind detection on a bit obtained through decoding by using a polar code, to obtain sent time sequence information. The transmit end interleaves the encoded bits in each group of sequence based on the current time sequence. An example in which an interleaving manner is a cyclic shift is used. For example, if a cyclic shift with a value of N/L/4*(the time sequence−1) is performed, if two pieces of time sequence information are required, a cyclic shift of N/L/2 is performed, or if four pieces of time sequence information are required, a cyclic shift of N/L/4 is performed.

Figure 9:
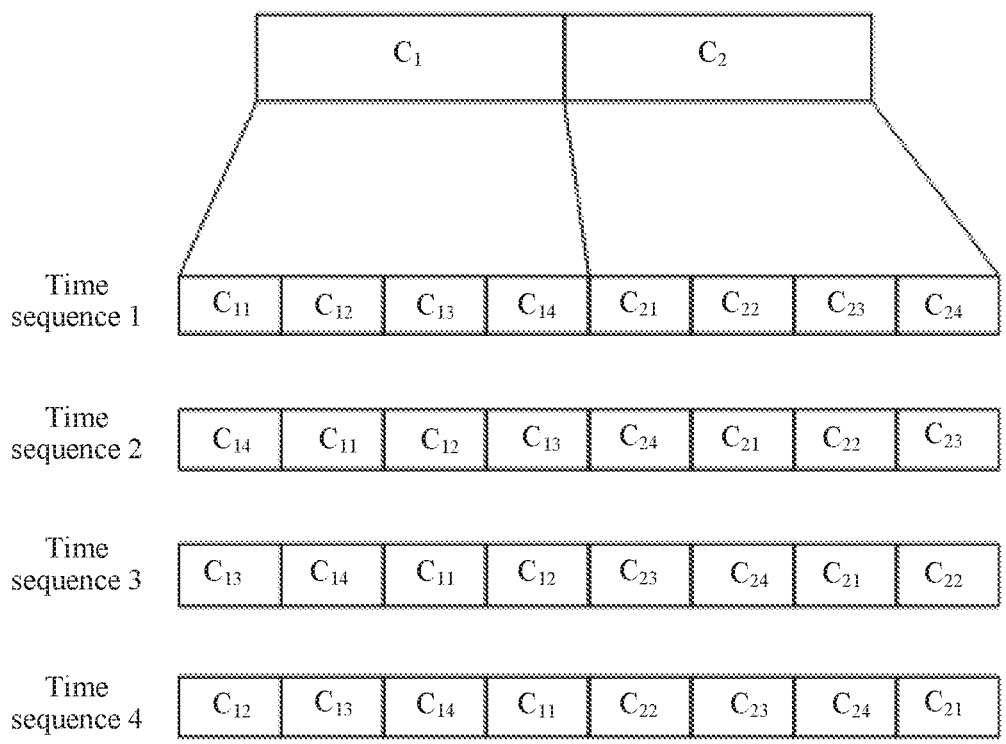
FIG. 9 is a schematic diagram of grouping and performing a cyclic shift on sequences obtained after grouping.

Specifically, FIG. 9 is a schematic diagram of grouping and performing a cyclic shift on sequences obtained after grouping. As shown in FIG. 9, first, the transmit end divides the second encoded bit sequence into two groups of sequences of equal lengths, where each group of sequence includes N/2 encoded bits, and N is the length of the second encoded bit sequence. Then the transmit end performs a cyclic shift on the encoded bits in each group of sequence based on the current time sequence. Cyclic shifts corresponding to four time sequences are shown in FIG. 9. The two groups of sequences, namely, $C_{11}, C_{12}, C_{13}$, and $C_{14}$ and $C_{21}, C_{22}, C_{23}$, and $C_{24}$, include a same quantity of encoded bits, and four cyclic shifts are performed to obtain four pieces of time sequence information.

Figure 10:
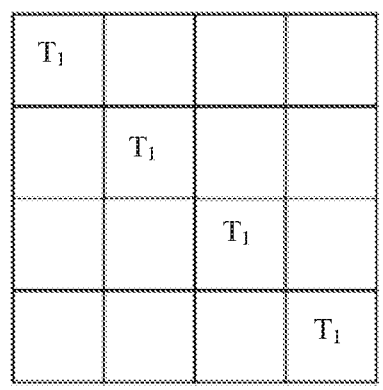
FIG. 10 is a schematic diagram of a transformation matrix T for performing a cyclic shift on a bit existing before encoding.
Figure 11:
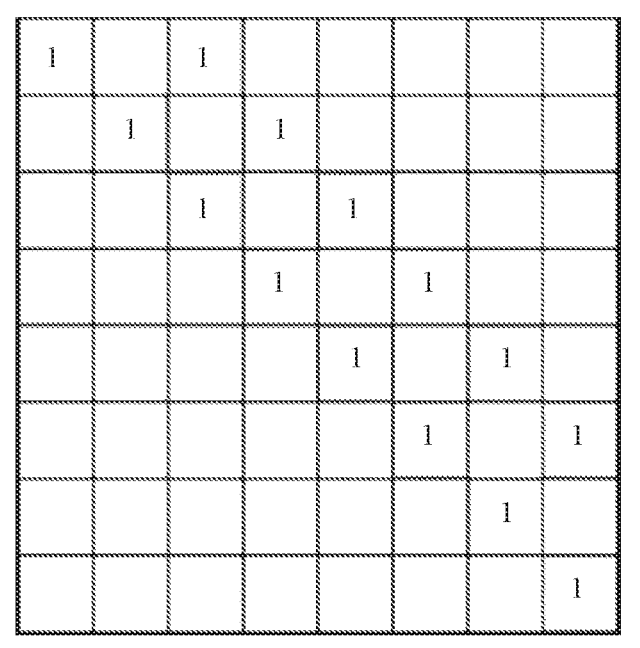

The encoded bits are grouped, and transformation of interleaving or scrambling of the groups is equivalent to grouping bits existing before encoding and performing corresponding transformation on the groups. FIG. 10 is a schematic diagram of a transformation matrix T for performing a cyclic shift on a bit existing before encoding. In this embodiment, the transformation matrix T for transformation of the bits existing before encoding that is equivalent to cyclic shifts of the groups of the encoded bits is shown in FIG. 10, where elements at blank positions are all 0s. FIG. 11 is a schematic diagram of a submatrix $T_1$, where the submatrix $T_1$ corresponds to a transformation matrix shown in FIG. 11.

According to the polar code transmission method provided in this embodiment, the encoded bits are first grouped to obtain a plurality of groups of sequences, and each group of sequence is interleaved or scrambled to obtain different encoded bit sequences, to implicitly carry time sequence information. A latency can be reduced during decoding, and during rate matching (puncturing), especially puncturing from front to back in order, in this manner, because a set of encoded bits that is affected by a cyclic shift is relatively small, a relatively small quantity of puncturing bits are affected, so that more stable performance is achieved.

Figure 12:
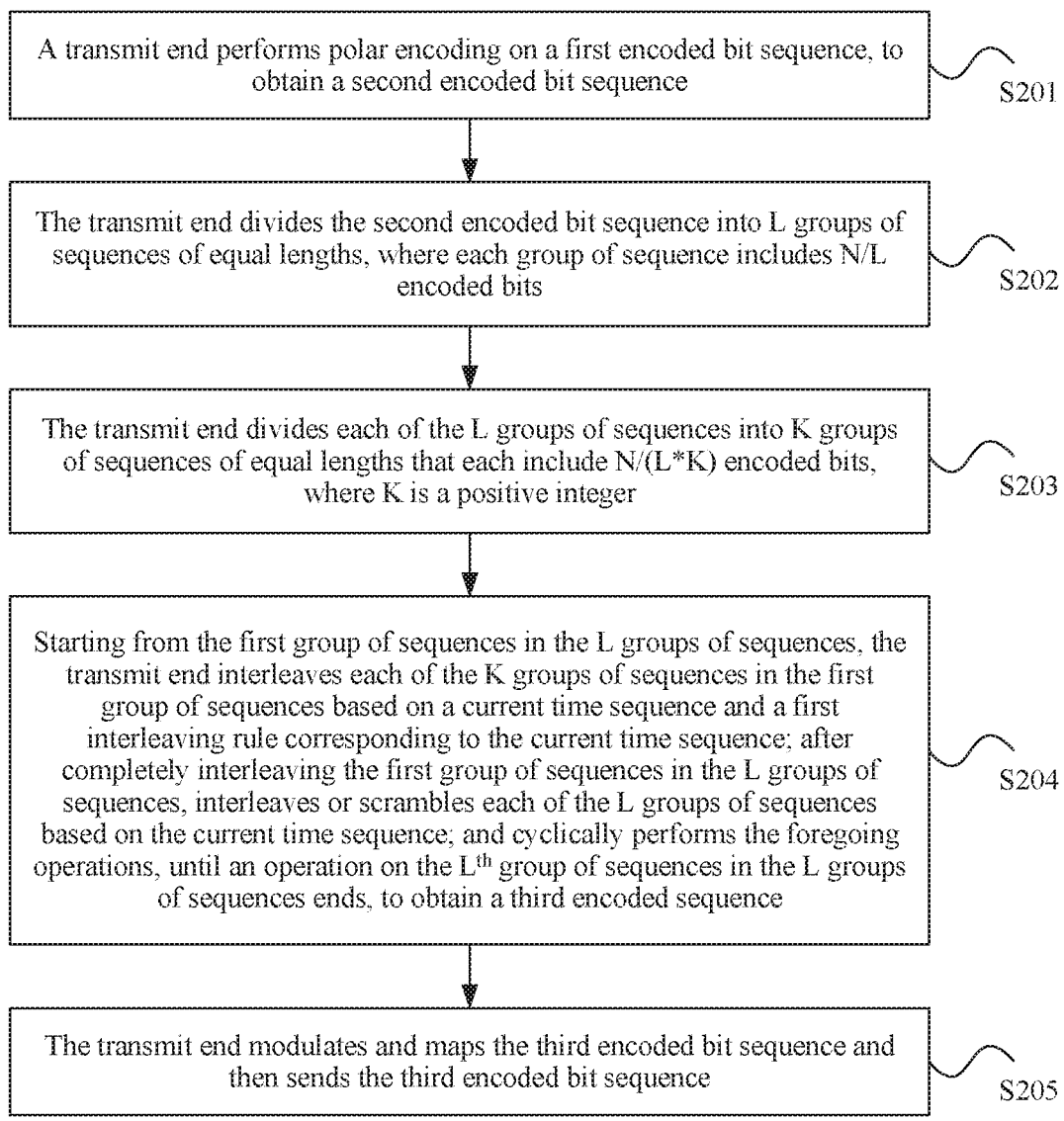
FIG. 12 is a flowchart of an embodiment of a polar code transmission method according to this application.

To meet requirement of transmission of a 5G PBCH in a plurality of levels of time sequences, FIG. 12 is a flowchart of an embodiment of a polar code transmission method according to this application. In this embodiment, two levels of time sequences are used as an example, each level corresponds to a time sequence information version quantity, and time sequence information version quantities corresponding to the levels may be the same or different. A time sequence version quantity corresponding to the first level is L, and a time sequence version quantity corresponding to the second level is K. As shown in FIG. 12, the method in this embodiment may include the following operations.

In operation S201a transmit end performs polar encoding on a first encoded bit sequence, to obtain a second encoded bit sequence.

Specifically, the first encoded bit sequence may include information bits and CRC bits in to-be-encoded information. When the CRC bits are included, the transmit end adds the CRC bits to information bits in the to-be-encoded information, to obtain the first encoded bit sequence.

In operation S202, the transmit end divides the second encoded bit sequence into L groups of sequences of equal lengths, where each group of sequence includes N/L encoded bits, N is a length of the second encoded bit sequence, and L and N are positive integers.

In operation S203, the transmit end divides each of the L groups of sequences into K groups of sequences of equal lengths that each include N/(K*L) encoded bits, where K is a positive integer.

In operation S204, starting from the first group of sequences in the L groups of sequences, the transmit end interleaves each of the K groups of sequences in the first group of sequences based on a current time sequence and a first interleaving rule corresponding to the current time sequence; after completely interleaving the first group of sequences in the L groups of sequences, interleaves or scrambles each of the L groups of sequences based on the current time sequence; and cyclically performs the foregoing operations, until an operation on the $L^{th}$ group of sequences in the L groups of sequences ends, to obtain a third encoded sequence.

Specifically, the following operation is first performed on the K groups of sequences in the first group of sequences: interleaving each of the K groups of sequences, to obtain K pieces of time sequence information; then each of the L groups of sequences is interleaved or scrambled based on the current time sequence; and the foregoing operations are cyclically performed, until the operation on the $L^{th}$ group of sequences in the L groups of sequences ends.

Figure 13A:
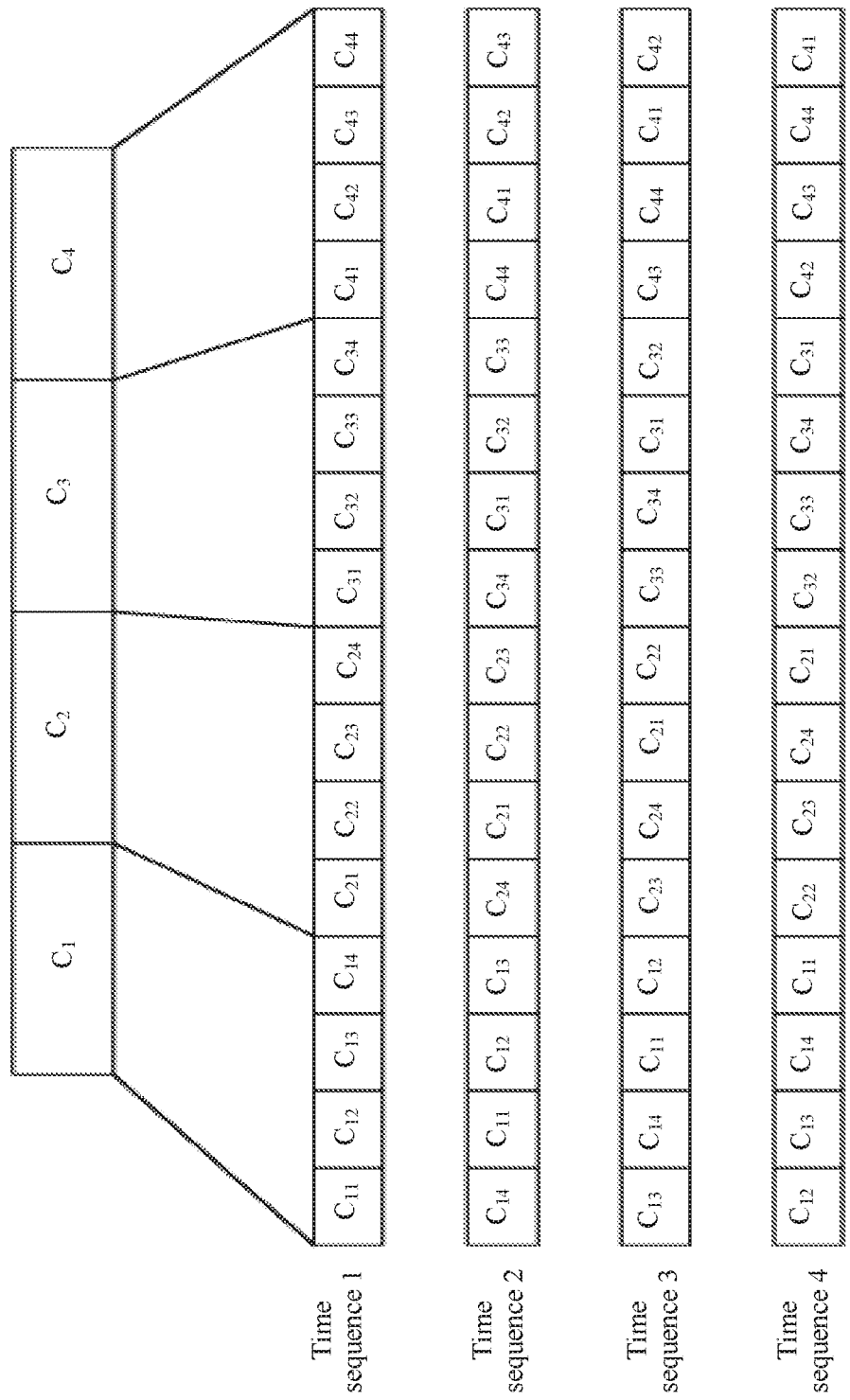
FIG. 13a and FIG. 13b each are a schematic diagram of a hierarchical interleaving process according to this application.
Figure 13B:
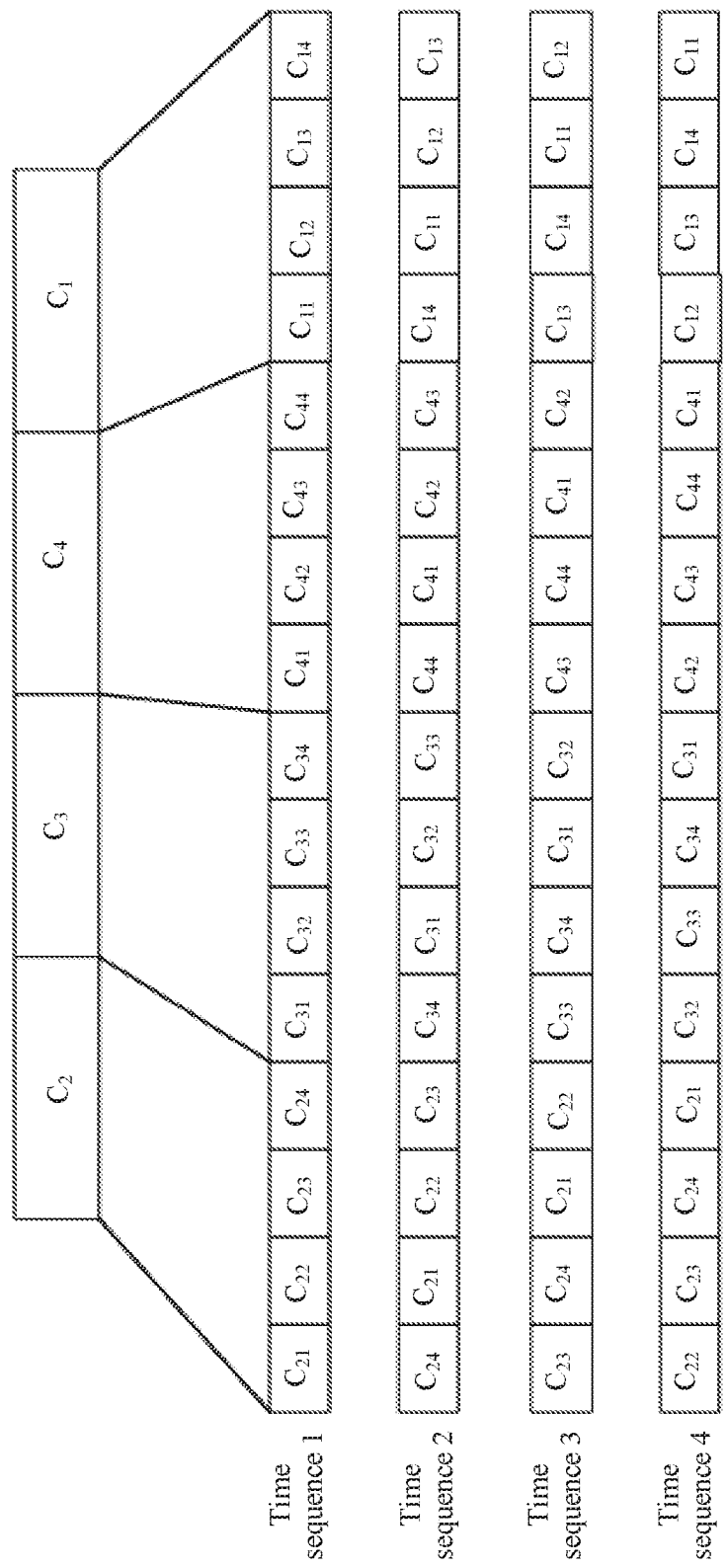

For example, a time sequence version quantity corresponding to the first level is 4 and a time sequence version quantity corresponding to the second level is 4. A cyclic shift is used as an example. FIG. 13a and FIG. 13b each are a schematic diagram of a hierarchical interleaving process according to this application. As shown in FIG. 13a and FIG. 13b, the transmit end divides the second encoded bit sequence into four groups ($C_1, C_2, C_3, C_4$) of sequences of equal lengths, then divides each group of sequence into four groups of sequences, for example, divides $C_1$ into $C_{11}, C_{12}, C_{13}$, and $C_{14}$, divides $C_2$ into $C_{21}, C_{22}, C_{23}$, and $C_{24}$, and so on, and performs four cyclic shifts on each of first-level sequences and second-level sequences in the following order:

(1, 1)→(1, 2)→(1, 3)→(1, 4)→(2, 1)→(2, 2)→(2, 3)→(2, 4)→(3, 1)→(3, 2)→(3, 3)→(3, 4)→(4, 1)→(4, 2)→(4, 3)→(4, 4), where each bracket represents a time sequence, a first-level element in the bracket indicates first-level time sequence information, and the second element is used as second-level time sequence information.

FIG. 13a is a schematic diagram of four time sequences obtained by performing a cyclic shift on four groups of sequences at a second level when no cyclic shift is performed at a first level, and FIG. 13b is a schematic diagram of four time sequences obtained by performing a cyclic shift on four groups of sequences at a second level when one cyclic shift is performed at a first level.

In operation S205, the transmit end modulates and maps the third encoded bit sequence and then sends the third encoded bit sequence.

According to the polar code transmission method provided in this embodiment, first grouping is first performed on the encoded bits to obtain a plurality of groups of sequences, each group of sequence is then grouped to obtain a plurality of groups of sequences, and sequences obtained through two times of grouping are separately interleaved or scrambled, so that different encoded bit sequences can be obtained, and more versions of time sequence information can be implemented, thereby meeting a requirement of transmission in a plurality of levels of time sequences.

Figure 14:
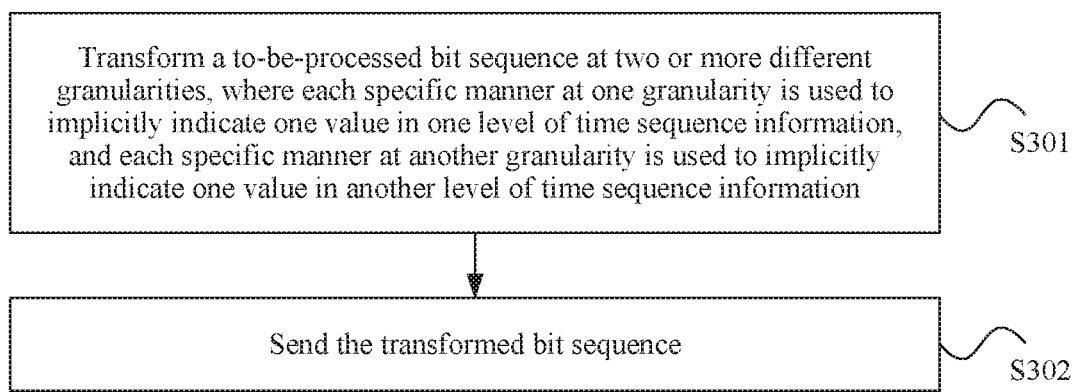
FIG. 14 is a flowchart of an embodiment of a polar code transmission method according to this application.

FIG. 14 is a flowchart of an embodiment of a polar code transmission method according to this application. In the method, a cyclic shift or interleaving (processing) may be performed on a to-be-processed bit sequence at two or more different granularities, and different levels of time sequence information are implicitly indicated respectively based on different transformation (processing) types. The different levels of time sequence information include first-level time sequence information and second-level time sequence information included in the first-level time sequence information. The first-level time sequence information is, for example, a sequence number of an SS burst, and the second-level time sequence information is, for example, a sequence number of an SS block in an SS burst. Alternatively, the first-level time sequence information is, for example, a sequence number of an SS burst set, and the second-level time sequence information is, for example, a sequence number of an SS burst. Certainly, more levels of time sequence information, for example, an SS burst set, may alternatively be included.

The method includes the following operations.

In operation S301a to-be-processed bit sequence is transformed (for example, interleave (perform a cyclic shift on) or scramble) at two or more different granularities, where each specific manner at one granularity is used to implicitly indicate one value in one level of time sequence information, and each specific manner at another granularity is used to implicitly indicate one value in another level of time sequence information. In one embodiment, higher-level time sequence information is implicitly indicated through a cyclic shift or interleaving at a larger granularity, and a lower-level time sequence information is implicitly indicated through a cyclic shift or interleaving at a smaller granularity.

The to-be-processed bit sequence may be an input bit sequence existing before encoding by using a polar code, or may be a bit sequence obtained after encoding by using a polar code. At a receive end, corresponding inverse processing may be performed at a corresponding position.

In operation S302, the transformed (processed) bit sequence is sent. Another required operation needs to be performed with reference to a communications technology. For example, modulation and resource mapping may be performed on the bit sequence obtained after polar encoding and then the bit sequence is sent. For a bit sequence existing before polar encoding, polar encoding needs to be performed on a correspondingly transformed (processed) bit sequence, and the bit sequence is sent after rate matching (optional) and modulation and resource mapping are performed.

Figure 15:
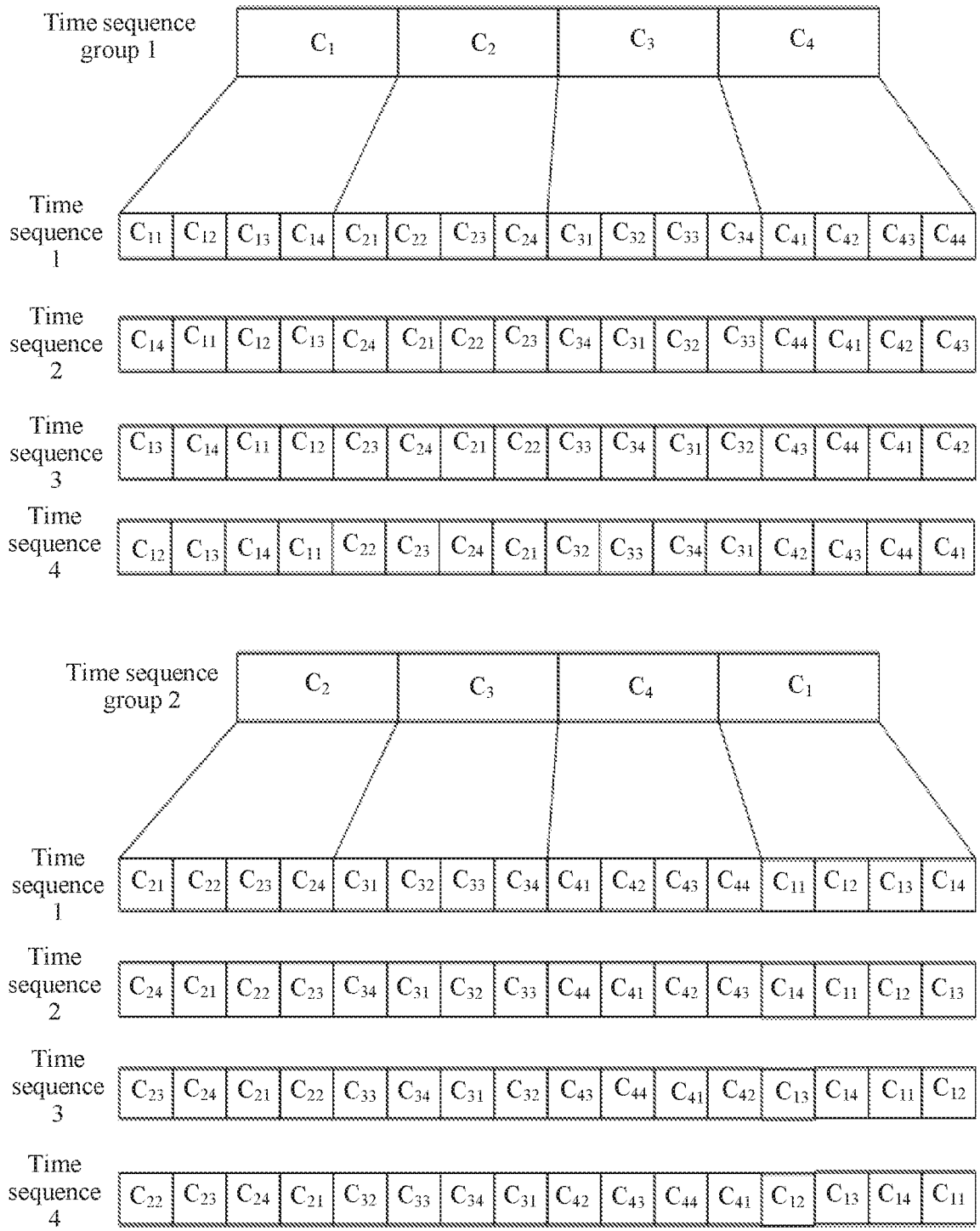
FIG. 15 is a diagram of an example of transmission in two levels of time sequences.

This embodiment provides a polar code transmission method that can be used to implicitly indicate hierarchical time sequence information of a PBCH. FIG. 15 is a diagram of an example of transmission in two levels of time sequences. First-level time sequence information, for example, a sequence number of an SS burst, is implicitly indicated through a cyclic shift of an entire codeword (namely, the first granularity) (between different SS bursts). Different second-level time sequence information, for example, a time sequence 1, a time sequence 2, a time sequence 3, or a time sequence 4 in a time sequence group 1 in FIG. 15, is implicitly indicated through interleaving or a cyclic shift of a group of entire codewords (namely, the second granularity) (for SS blocks in each SS burst). If each group is further divided to smaller groups (or granularities), transmission in more levels of time sequences can be further implicitly indicated, provided that cyclic shift manners (the entire codeword or the group of codewords) for different levels are different, and do not need to correspond to the foregoing manner.

At the receive end, for SS blocks in an SS burst, intra-burst inverse interleaving or an inverse cyclic shift is first performed based on a relative intra-burst interleaving or shift value, soft combination is performed, and then decoding by using the polar code and blind detection are performed. For SS blocks in different SS bursts, if relative positions of the SS blocks are the same in the bursts, an inverse cyclic shift is first performed on an entire codeword based on a relative shift value for the entire codeword, soft combination is performed, and then decoding by using the polar code and blind detection are performed. If relative positions of the SS blocks are different in the bursts, an inverse cyclic shift is first performed on an entire codeword based on a relative shift value for the entire codeword, the SS blocks are shifted to become received signals with same relative positions, intra-burst inverse interleaving or an inverse cyclic shift is performed based on a relative intra-burst interleaving or shift value, soft combination is performed, and then decoding by using the polar code and blind detection are performed.

An embodiment provides a polar code transmission method. In the method, two or more types of transformation (processing) may be performed on a to-be-processed bit sequence, and different levels of time sequence information are implicitly indicated respectively based on different transformation (processing) types (for example, different scrambling and different cyclic shifts). The different levels of time sequence information include first-level time sequence information and second-level time sequence information included in the first-level time sequence information. The first-level time sequence information is, for example, a sequence number of an SS burst, and the second-level time sequence information is, for example, a sequence number of an SS block in an SS burst. Alternatively, the first-level time sequence information is, for example, a sequence number of an SS burst set, and the second-level time sequence information is, for example, a sequence number of an SS burst.

At a receive end, an inverse transformation type is obtained through blind detection of a received bit sequence, to determine or obtain time sequence information implicitly indicated by the transformation type.

The method includes the following operations.

In operation S401, two more types of transformation (processing) are performed on a to-be-processed bit sequence, where each specific manner in one type is used to implicitly indicate one value in one level of time sequence information, and each specific manner in another type is used to implicitly indicate one value in another level of time sequence information. Alternatively, different specific manners in one type are used to implicitly indicate different time sequence information at one level, and different specific manners in another type are used to implicitly indicate different time sequence information at another level.

The to-be-processed bit sequence may be an input bit sequence existing before encoding by using a polar code, or may be a bit sequence obtained after encoding by using a polar code. At the receive end, corresponding inverse processing may be performed at a corresponding position.

In operation S402, the transformed (processed) bit sequence is sent. Another required operation needs to be performed with reference to a communications technology. For example, modulation and resource mapping may be performed on the bit sequence obtained after polar encoding and then the bit sequence is sent. For a bit sequence existing before polar encoding, polar encoding needs to be performed on a correspondingly transformed (processed) bit sequence, and the bit sequence is sent after rate matching (optional) and modulation and resource mapping are performed.

FIG. 16 is a diagram of an example of transmission in two levels of time sequences. Referring to FIG. 16, a processing type may be a scrambling manner. Different scrambling manners are used to indicate one level of time sequence information, for example, first-level time sequence information. The processing type may be a cyclic shift. A shift manner of the cyclic shift is used to indicate another level of time sequence information, for example, second-level time sequence information.

FIG. 17 is a diagram of an example of transmission in two levels of time sequences. Referring to FIG. 17, the processing type may be a cyclic shift. A shift manner of the cyclic shift is used to indicate one level of time sequence information, for example, first-level time sequence information. Another processing type may be a scrambling manner. Different scrambling manners are used to another level of time sequence information, for example, second-level time sequence information.

Methods for implementing different levels of time sequence information of a PBCH by using the foregoing method are respectively described in detail below for FIG. 16 and FIG. 17.

FIG. 16 shows an example of information transmission in two levels of time sequences. Sequence numbers of SS bursts are implicitly indicated in different scrambling manners (in different SS bursts). Sequence numbers of different SS blocks are implicitly indicated through a cyclic shift of an entire codeword (in each SS burst). As shown in FIG. 16, first-level time sequence information includes a time sequence group sequence number 1 and a time sequence group sequence number 2. Two time sequence groups may be scrambled by using all 1s, to implicitly indicate sequence numbers of the two time sequence groups (certainly, there may be other information used to indicate the time sequence groups). Certainly, more scrambling manners may be used to indicate more time sequence group sequence numbers.

As shown in FIG. 17, second-level time sequence information includes a time sequence 1, a time sequence 2, a time sequence 3, and a time sequence 4. In one time sequence group, the foregoing four time sequences are distinguished through a cyclic shift of an entire codeword, and a shift value is N/4. That is, a specific manner of the cyclic shift may implicitly indicate four time sequences in one time sequence group. Certainly, the four time sequences are merely an example, and a quantity of time sequences may be 2, 3, or another natural number.

At the receive end, for SS blocks in an SS burst, an inverse cyclic shift and soft combination are first performed based on a relative shift value, and then decoding by using the polar code and blind detection are performed. For SS blocks in different SS bursts, if relative positions of the SS blocks are the same in the bursts, descrambling and soft combination are first performed, and then decoding by using the polar code and blind detection are performed. If relative positions of the SS blocks are different in the bursts, an inverse cyclic shift is first performed based on a relative shift value, the SS blocks are shifted to become received signals with same relative positions, then descrambling and soft combination are performed, and finally decoding by using the polar code and blind detection are performed.

Figure 18:
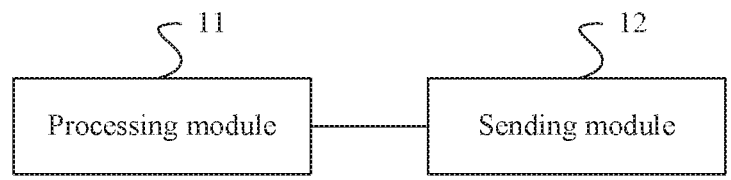
FIG. 18 is a schematic structural diagram of a polar code transmission apparatus according to this application.

FIG. 18 is a schematic structural diagram of a polar code transmission apparatus according to this application. As shown in FIG. 18, the apparatus in this embodiment may include a processing module 11 and a sending module 12. The processing module 11 is configured to perform the processing process shown in FIG. 8 or FIG. 12. The sending module 12 is configured to send an encoded bit sequence processed by using the processing module. For details, refer to the processing process shown in FIG. 8 or FIG. 12. Implementation principles and technical effects are similar. Details are not described herein again.

Figure 19:
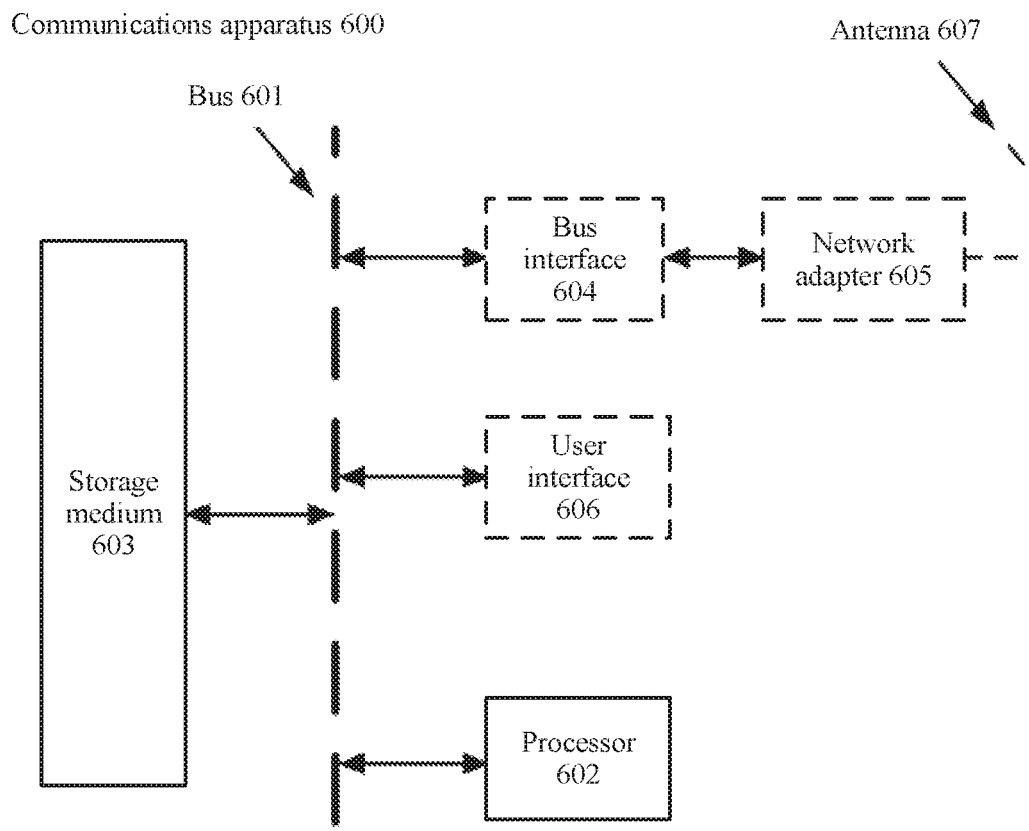
FIG. 19 is a schematic structural diagram of a communications apparatus 600.

A person skilled in the art may understand that, the foregoing polar code apparatus may be implemented by using hardware or a combination of software and hardware. Refer to FIG. 19 below. FIG. 19 is a schematic structural diagram of a communications apparatus 600, to describe the polar code transmission apparatus and a corresponding apparatus available for encoding according to this application.

Alternatively, the communications apparatus 600 may be configured as a general-purpose processing system. For example, the general-purpose processing system is usually referred to as a chip. The general-purpose processing system includes one or more microprocessors providing a function of a processor and an external memory providing at least a part of a storage medium 603. All these components are connected to other supporting circuits through an external bus architecture.

Alternatively, the communications apparatus 600 may be implemented by using an ASIC (application-specific integrated circuit) having a processor 602, a bus interface 604, and a user interface 606, and by using at least a part of the storage medium 603 integrated into a single chip, or the communications apparatus 600 may be implemented by using one or more FPGAs (field programmable gate arrays), PLDs (programmable logic devices), controllers, state machines, gate logic, or discrete hardware components, any other suitable circuits, or any combination of circuits capable of performing the various functions described throughout this application.

FIG. 19 is the schematic structural diagram of the communications apparatus 600 (for example, a communications apparatus such as an access point, a base station, a station, or a terminal; or a chip in the communications apparatus) according to an embodiment of this application.

In an implementation, as shown in FIG. 19, the communications apparatus 600 may be implemented by a bus 601 as a general bus architecture. The bus 601 may include any quantity of interconnected buses and bridges based on a specific application and an overall design constraint of the communications apparatus 600. The bus 601 connects various circuits together. These circuits include the processor 602, the storage medium 603, and the bus interface 604. In one embodiment, the communications apparatus 600 connects a network adapter 605 and the like by using the bus 601 through the bus interface 604. The network adapter 605 may be configured to implement a signal processing function of a physical layer in a wireless communications network, and send and receive a radio frequency signal through an antenna 607. The user interface 606 may be connected to a user terminal such as a keyboard, a display, a mouse, or a joystick. The bus 601 may also be connected to other circuits, such as a timing source, a peripheral device, a voltage regulator, or a power management circuit. These circuits are well known in the art and therefore are not described in detail.

The processor 602 is responsible for bus management and general processing (including execution of software stored in the storage medium 603). The processor 602 may be implemented by using one or more general-purpose processors and/or dedicated processors. Examples of the processor include a microprocessor, a microcontroller, a DSP processor, and another circuit that can execute software. Software should be interpreted broadly to indicate an instruction, data, or any combination thereof regardless of whether the software is referred to as software, firmware, middleware, microcode, hardware description language, or others.

The following figure shows that the storage medium 603 is separated from the processor 602. However, a person skilled in the art can readily appreciate that the storage medium 603 or any part of the storage medium 603 may be located outside the communications apparatus 600. For example, the storage medium 603 may include a transmission line, a carrier waveform modulated by using data, and/or a computer product separated from a wireless node. All these media can be accessed by the processor 602 through the bus interface 604. Alternatively, the storage medium 603 or any part of the storage medium 603 may be integrated into the processor 602, for example, may be a cache and/or a general-purpose register.

The processor 602 may perform the method in the foregoing embodiments, for example, in FIG. 8, FIG. 12, or FIG. 14 and corresponding implementations, and an execution process of the processor 602 is not described herein again.

The communications apparatus described in the embodiments of this application may be a wireless communications device such as an access point, a station, a base station, or a user terminal.

The polar code described in the embodiments of this application includes but is not limited to an Arikan polar code, or may be a CA-polar code or a PC-polar code. The Arikan polar is an original polar code concatenated with no other codes, and includes only an information bit and a frozen bit. The CA-polar code is a polar code obtained after a polar code is concatenated with a cyclic redundancy check (CRC for short). The PC-polar code is a code obtained after a polar code is concatenated with a parity check (PC for short). The PC-polar and the CA-polar improve performance of the polar code by concatenating the original code with different codes.

A person of ordinary skill in the art may understand that all or some of the operations of the method embodiments may be implemented by a program instructing related hardware. The program may be stored in a computer-readable storage medium. When the program runs, the operations of the method embodiments are performed. The foregoing storage medium includes: any medium that can store program code, such as a ROM, a RAM, a magnetic disk, or an optical disc.

What is claimed is:

1. A polar code transmission method, comprising:
   transforming a to-be-processed bit sequence at two or more different granularities, wherein each specific manner at a first granularity is used to implicitly indicate one value in a first level of time sequence information, and each specific manner at a second granularity is used to implicitly indicate one value in a second level of time sequence information, and wherein the first level is higher level time sequence information indicated at a larger granularity than the second level time sequence information indicated at a smaller granularity; and
   sending the transformed bit sequence.

2. The method according to claim 1, wherein the method further comprises:
   adding cyclic redundancy check (CRC) bits to information bits in to-be-encoded information, to obtain a first encoded bit sequence; and
   performing polar encoding on the first encoded bit sequence, to obtain a second encoded bit sequence.

3. The method according to claim 2, wherein the method further comprises:
   dividing the second encoded bit sequence into L groups of sequences of equal lengths, wherein each group of sequence comprises N/L encoded bits, N is a length of the second encoded bit sequence, and L and N are positive integers.

4. The method according to claim 3, wherein the method further comprises:
   interleaving or scrambling the encoded bits in each group of sequence based on a current time sequence, to obtain a third encoded bit sequence.

5. The method according to claim 4, wherein the method further comprises:
   performing rate matching on the third encoded bit sequence, to obtain encoded bits after the rate matching.

6. The method according to claim 1, wherein the to-be-processed bit sequence is an input bit sequence existing before encoding by using a polar code, or is a third encoded bit sequence.

7. The method according to claim 1, wherein the transforming a to-be-processed bit sequence at two or more different granularities is specifically:
   for different synchronization signal bursts SS bursts, implicitly indicating first-level time sequence information through a cyclic shift of an entire codeword; and
   for a synchronization signal block SS block in each synchronization signal burst set SS burst, implicitly indicating second-level time sequence information by using a group of entire codewords.

8. The method according to claim 7, wherein the first-level time sequence information is a sequence number of a synchronization signal burst SS burst, and the second-level time sequence information is a sequence number of a synchronization signal block SS block in a synchronization signal burst SS burst; or the first-level time sequence information is a sequence number of a synchronization signal burst set SS burst set, and the second-level time sequence information is a sequence number of a synchronization signal burst SS burst.

9. A polar code transmission apparatus, comprising:
   a processing module, configured to transform a to-be-processed bit sequence at two or more different granularities, wherein each specific manner at a first granularity is used to implicitly indicate one value in a first level of time sequence information, and each specific manner at a second granularity is used to implicitly indicate one value in a second level of time sequence information, and wherein the first level is higher level time sequence information indicated at a larger granularity than the second level time sequence information indicated at a smaller granularity; and
   a sending module, configured to send the transformed bit sequence.

10. The transmission apparatus according to claim 9, wherein the processing module is further configured to:
    add cyclic redundancy check (CRC) bits to information bits in to-be-encoded information, to obtain a first encoded bit sequence; and
    perform polar encoding on the first encoded bit sequence, to obtain a second encoded bit sequence.

11. The transmission apparatus according to claim 10, wherein the processing module is further configured to:
    divide the second encoded bit sequence into L groups of sequences of equal lengths, wherein each group of sequence comprises N/L encoded bits, N is a length of the second encoded bit sequence, and L and N are positive integers.

12. The transmission apparatus according to claim 11, wherein the processing module is further configured to:
    interleave or scramble the encoded bits in each group of sequence based on a current time sequence, to obtain a third encoded bit sequence.

13. The transmission apparatus according to claim 12, wherein the processing module is further configured to:
perform rate matching on the third encoded bit sequence, to obtain encoded bits after the rate matching.

14. The transmission apparatus according to claim 9, wherein the to-be-processed bit sequence is an input bit sequence existing before encoding by using a polar code, or is a third encoded bit sequence.

15. The transmission apparatus according to claim 9, wherein the processing module is specifically configured to:
for different synchronization signal bursts SS bursts, implicitly indicate first-level time sequence information through a cyclic shift of an entire codeword; and
for a synchronization signal block SS block in each synchronization signal burst set SS burst, implicitly indicate second-level time sequence information by using a group of entire codewords.

16. The transmission apparatus according to claim 15, wherein the first-level time sequence information is a sequence number of a synchronization signal burst SS burst, and the second-level time sequence information is a sequence number of a synchronization signal block SS block in a synchronization signal burst SS burst; or the first-level time sequence information is a sequence number of a synchronization signal burst set SS burst set, and the second-level time sequence information is a sequence number of a synchronization signal burst SS burst.

17. A non-transitory statutory computer-readable medium for storing instructions, which when executed by a processor, cause the processor to perform a method, the method comprising:
transforming a to-be-processed bit sequence at two or more different granularities,
wherein
each specific manner at a first granularity is used to implicitly indicate one value in a first level of time sequence information, and each specific manner at a second granularity is used to implicitly indicate one value in a second level of time sequence information, and wherein the first level is higher level time sequence information indicated at a larger granularity than the second level time sequence information indicated at a smaller granularity; and
sending the transformed bit sequence.

18. The non-transitory statutory computer-readable medium of claim 17, wherein the method further comprises:
adding cyclic redundancy check (CRC) bits to information bits in to-be-encoded information, to obtain a first encoded bit sequence; and
performing polar encoding on the first encoded bit sequence, to obtain a second encoded bit sequence.

19. The non-transitory statutory computer-readable medium of claim 18, wherein the method further comprises:
dividing the second encoded bit sequence into L groups of sequences of equal lengths, wherein each group of sequence comprises N/L encoded bits, N is a length of the second encoded bit sequence, and L and N are positive integers.

20. The non-transitory statutory computer-readable medium of claim 19, wherein the method further comprises:
interleaving or scrambling the encoded bits in each group of sequence based on a current time sequence, to obtain a third encoded bit sequence.

* * * * *